United States Patent

Naeem et al.

[11] Patent Number: 5,846,884
[45] Date of Patent: Dec. 8, 1998

[54] METHODS FOR METAL ETCHING WITH REDUCED SIDEWALL BUILD UP DURING INTEGRATED CIRCUIT MANUFACTURING

[75] Inventors: Munir D. Naeem, Poughkeepsie, N.Y.; Stuart M. Burns, Ridgefield, Conn.; Nancy Greco; Steve Greco, both of LaGrangeville, N.Y.; Virinder Grewal, Ebersberg, Germany; Ernest Levine, Poughkeepsie, N.Y.; Masaki Narita, Yokohama, Japan; Bruno Spuler, Wappingers Falls, N.Y.

[73] Assignees: Siemens Aktiengesellschaft, Munich, Germany; International Business Machines Corporation, Armonk, N.Y.; Kabushiki Kaisha Toshiba, Kanagawa-Ken, Japan

[21] Appl. No.: 879,727

[22] Filed: Jun. 20, 1997

[51] Int. Cl.[6] .................................................... H01L 21/00
[52] U.S. Cl. ........................... 438/714; 438/712; 438/738
[58] Field of Search ..................................... 438/653, 656, 438/688, 712, 714, 720, 737, 738, 742; 216/67, 75, 77; 204/192.32, 192.35, 192.36; 252/79.1

[56] References Cited

U.S. PATENT DOCUMENTS

| | | | |
|---|---|---|---|
| 5,094,712 | 3/1992 | Becker et al. ........................... | 156/643 |
| 5,118,383 | 6/1992 | Engelhardt ............................... | 156/643 |
| 5,221,425 | 6/1993 | Blanchard et al. ..................... | 156/643 |
| 5,370,972 | 12/1994 | Saia et al. ............................... | 430/311 |
| 5,378,648 | 1/1995 | Lin et al. .................................. | 437/52 |
| 5,455,419 | 10/1995 | Bayer et al. ......................... | 250/423 F |
| 5,462,892 | 10/1995 | Gabriel ..................................... | 437/189 |
| 5,527,729 | 6/1996 | Matsumoto et al. ............... | 438/714 X |
| 5,545,290 | 8/1996 | Douglas ............................... | 156/646.1 |
| 5,562,801 | 10/1996 | Nulty .................................... | 156/643.1 |
| 5,575,888 | 11/1996 | Kosakowski et al. .............. | 156/651.1 |
| 5,599,424 | 2/1997 | Matsumoto et al. ................ | 156/643.1 |
| 5,652,171 | 7/1997 | Nagano et al. ..................... | 438/714 X |
| 5,772,906 | 6/1998 | Abraham ............................. | 438/714 X |

*Primary Examiner*—William Powell
*Attorney, Agent, or Firm*—Stanton C. Braden

[57] ABSTRACT

A method in a plasma processing chamber for etching through a selected portion of a layer stack. The layer stack comprises a metallization layer, a first barrier layer disposed adjacent to the metallization layer, and a photoresist layer disposed above the metallization layer. The method includes etching at least partially through the first barrier layer using a high sputter component etch. The method further includes etching at least partially through the metallization layer using a low sputter component etch. The low sputter component etch has a sputter component lower than a sputter component of the high sputter component etch.

21 Claims, 5 Drawing Sheets

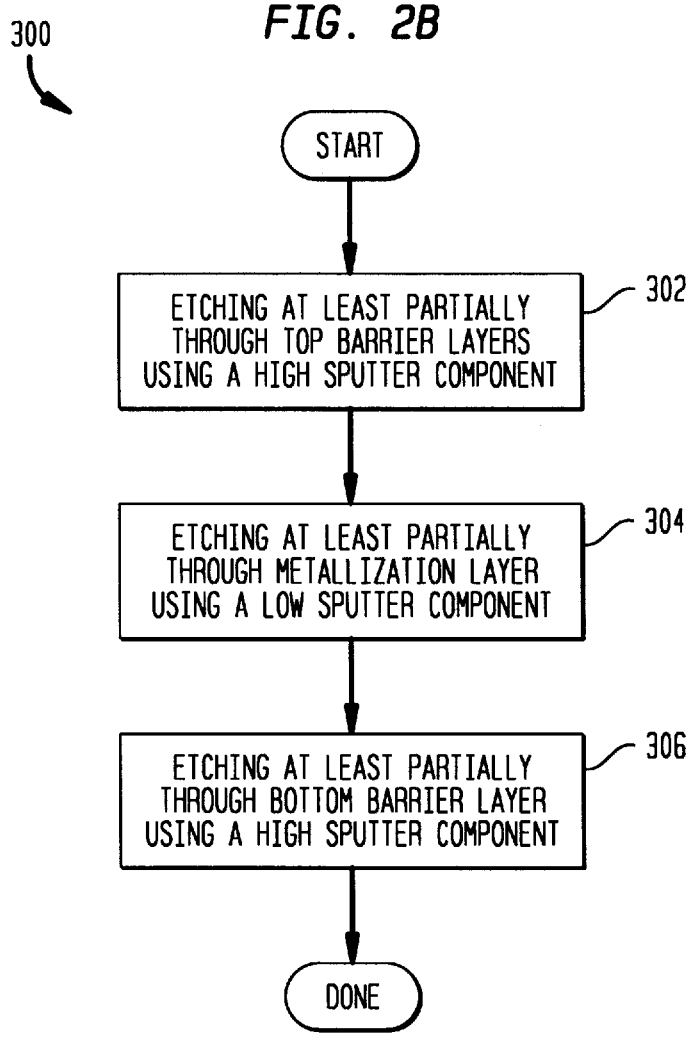

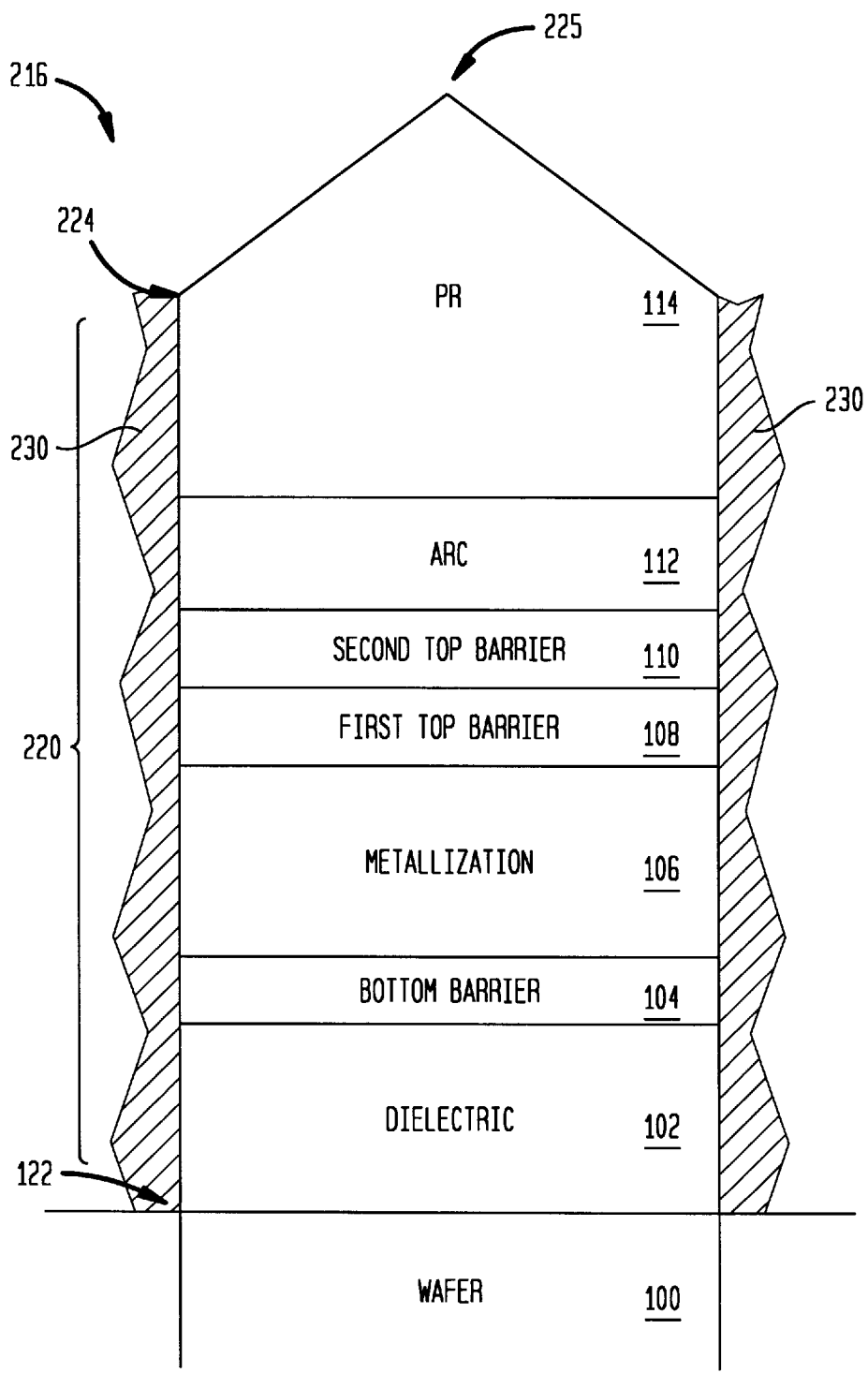

5,846,884

METHODS FOR METAL ETCHING WITH REDUCED SIDEWALL BUILD UP DURING INTEGRATED CIRCUIT MANUFACTURING

BACKGROUND OF THE INVENTION

The present invention relates to the fabrication of semiconductor integrated circuits (IC's). More particularly, the present invention relates to methods and apparatuses for etching through an IC's layer stack so that the polymer deposition that is formed during the etch may be more easily removed after etching.

In semiconductor IC fabrication, devices such as component transistors, capacitors, and resistors are formed in and/or on a semiconductor wafer or substrate, which is typically made of silicon. Other wafers, such as gallium arsenide or silicon on isulator are also useful. Metallic interconnect lines, which are etched from a metallization layer disposed above the wafer, are then employed to couple the devices together to form a desired circuit. To facilitate discussion, FIG. 1A illustrates a simplified (and not to scale) cross-section view of a layer stack 20, representing the layers that may be formed during the fabrication of a typical semiconductor IC.

At the bottom of layer stack 20, there is shown a wafer 100. For simplicity, the wafer includes various devices. An oxide or interlayer dielectric layer 102, which is typically formed of silicon dioxide, is shown formed over the surface of wafer 100. Doped or undoped silicate glass, including BSG, PSG, and BPSG, are also useful to form the dielectric layer. A bottom barrier layer 104, typically formed of Ti, TiW, TiN, Ta Nitride, Tungsten Carbide, Chromium Nitride, Hafnium Nitride, Ti Carbide, Hafnium Carbide, Molybenum Carbide, or other suitable barrier materials, may be disposed above interlevel dielectric layer 102 and adjacent to a subsequently deposited metallization layer 106. Bottom barrier layer 104 may be a single film or a composite layer made up of multiple films. Bottom barrier layer 104, when provided, functions to substantially prevent diffusion of silicon atoms from interlayer dielectric layer 102 into metallization layer 106 and improve reliability.

Metallization layer 106 is typically formed of aluminum, copper, or any unknown aluminum alloy such as Al—Cu, Al—Si, and Al—Cu—Si, or conductive material. The remaining layers of layer stack 20 may include top barrier layers 108 and 110 formed over or adjacent to metallization layer 106, an anti-reflective coating (ARC) layer 112 that is formed above top barrier layers 108 and 110, and an overlying photoresist (PR) layer 114 formed over ARC layer 112. As is well known in the art, ARC layer 112 is typically composed of Ti, TiN, TiW and/or other refractory metals. Generally speaking, ARC layer 112 is useful in preventing light used in the photolithography process from reflecting and scattering, and may, in some cases, inhibit hillock growth (e.g., if the ARC layer is a refractory metal with certain stress characteristics). The ARC layer may also be organic in nature. In some layer stacks, the ARC layer is sometimes not required.

The layers of layer stack 20 are readily recognizable to those skilled in the art and may be formed using any number of known deposition processes, including chemical vapor deposition (CVD), plasma-enhanced chemical vapor deposition (PECVD), and physical vapor deposition (PVD) such as sputtering and/or electroplating. Although the layers shown are representative, it should be noted that other additional layers above, below, or between the layers shown may be present. Further, not all of the illustrated layers need necessarily be present and some or all may be substituted by a variety of different layers. By way of example, one or more layers may be disposed between the barrier layer and the metallization layer without negating the function of the barrier layer.

To create the aforementioned metallic interconnect lines, PR layer 114 is patterned using a suitable photolithography technique, and subsequently the exposed metal film(s) are etched. By way of example, one such photolithography technique involves the patterning of photoresist layer 114 by exposing the photoresist material in a contact or stepper photolithography and/or x-ray apparatus, and the development of the photoresist material to form a patterned mask that exposes certain portions of the underlying ARC, barrier, and metallization layers. In this manner, etchants may subsequently be used to etch away portions of the underlying layers that are not covered by the photoresist mask. Accordingly, the remaining metallization material will form a plurality of interconnect lines that are consistent with a selected functional circuit pattern.

FIG. 1B shows an interconnect line 116 formed from unetched portions of layer stack 20 of FIG. 1A after a conventional etching process is completed. Such etching process includes, for example, reactive ion etching (RIE). An interconnect line 116 is formed by unetched portions of metallization layer 106. Chemicals used in RIE of layer stack 20 includes, for example, chlorine ($Cl_2$) and boron chloride ($BCl_3$). Other etchant chemicals such as HCl, HI, $CH_4$, and/or $CHCl_3$ are also useful in RIE of layer stack 20.

During etching, some photoresist erosion takes place in addition to the vertical etching through layers 112, 110, 106, 104, and 102 of interconnect line 116. As a result, a top surface of PR layer 114 may become sloped. Some of the eroded photoresist material may become deposited along sidewalls 120 of interconnect line 116, thereby passivating the sidewalls with polymers.

In general, the passivation of the sidewalls is not necessarily undesirable. For example, sidewall passivation has been known to assist in maintaining profile control during the etch and to prevent the etchant from undercutting the etched features, among others.

During sidewall passivation, however, some of the etchants (e.g., chlorine) and etched materials from the etched layers (e.g., materials from interlayer dielectric layer 102 or metallization layer 106, among others) may become absorbed into the polymer deposition formed along sidewalls 120. The polymer deposition along sidewalls 120 is thus impregnated with inorganic and organic materials including, for example, $Cl_2$, $SiO_2$, Si, carbon, Ti, Al, and the like.

After etching, it is typically necessary to remove the overlying photoresist mask along with any polymer deposition on sidewalls 120. Conventionally, the photoresist removal is achieved by use of plasma stripping and water rinse processes subsequent to etching. In the plasma stripping process step, water vapor and oxygen in a plasma state are used to remove as much of the photoresist and polymer as possible. The water rinse step is used to further remove polymerization and to further dilute any corrosive gases, such as chlorine, that has been absorbed into the polymer sidewalls. A problem that arises is that the absorbed inorganic materials cause difficulty in removing the polymer deposition on sidewalls 120 during the subsequent photoresist strip and water rinse processes. In other words, while the photoresist strip and water rinse processes typically succeed in removing substantially all the overlying photoresist mask material, these prior art processes have not been as successful in completely removing the sidewall deposition that has been impregnated with inorganic materials. This requires additional processing, e.g., wet chemical treatment, to achieve the desired results.

FIG. 1B illustrates a rail 130 formed from the sidewall deposition material that remains partially adhered to sidewall 120 after photoresist stripping. During rinsing, rail 130 may become dislodged from sidewalls 120 and may be redeposited on the surface of the wafer. As can be appreciated by those skilled in the art, the presence of rail 130 (essentially a strip of polymer that has been impregnated with inorganic materials) on the wafer surface is highly undesirable. At minimum, these rails represent unwanted contaminants and can lead to a noise in photo limited yield data (PLY data). The presence of the rails can also lead to a potential reliability problem during subsequent processing steps (e.g., dielectric fill) or during operation of the integrated circuit (IC) that results.

In view of the foregoing, what is needed is an etch in which the sidewall deposition that is formed during etching may be more easily removed by a subsequent plasma stripping process and/or a water rinse process.

SUMMARY OF THE INVENTION

The invention relates, in one embodiment to a method in a plasma processing chamber for etching through a selected portion of a layer stack. The layer stack comprises a metallization layer, a first barrier layer disposed adjacent to the metallization layer, and a photoresist layer disposed above the metallization layer. The method includes etching at least partially through the first barrier layer using a high sputter component etch. The method further includes etching at least partially through the metallization layer using a low sputter component etch. The low sputter component etch has a sputter component lower than a sputter component of the high sputter component etch.

In another embodiment, the invention relates to a method in a plasma processing chamber for reducing sidewall polymer buildup during etching through a selected portion of a layer stack. The layer stack includes a bottom barrier layer, a metallization layer disposed above the bottom barrier layer, a top barrier layer disposed above the metallization layer, and a photoresist layer disposed above the metallization layer.

The method includes etching at least partially through the top barrier layer using a first chamber pressure. The method further includes etching at least partially through the metallization layer using a second chamber pressure higher than the first chamber pressure. The first chamber pressure is configured to cause the top barrier layer to be etched with a higher sputter component than a sputter component associated with the second Chamber pressure. There is further included etching at least partially through the bottom barrier layer using a third chamber pressure lower than the second chamber pressure. The third chamber pressure is configured to cause the bottom barrier layer to be etched with a higher sputter component than the sputter component associated with the second chamber pressure. These and other advantages of the present invention will become apparent upon reading the following detailed descriptions and studying the various figures of the drawings.

BRIEF DESCRIPTION OF THE DRAWINGS

The invention, together with further advantages thereof, may best be understood by reference to the following description taken in conjunction with the accompanying drawings in which:

FIG. 2B is a flow diagram of a multiple step etching process according to one embodiment of the present invention.

FIG. 3 illustrates a cross-section vies of an exemplary layer stack after it is etched in accordance with the inventive etching technique.

DETAILED DESCRIPTION OF THE INVENTION

Figure 1A:
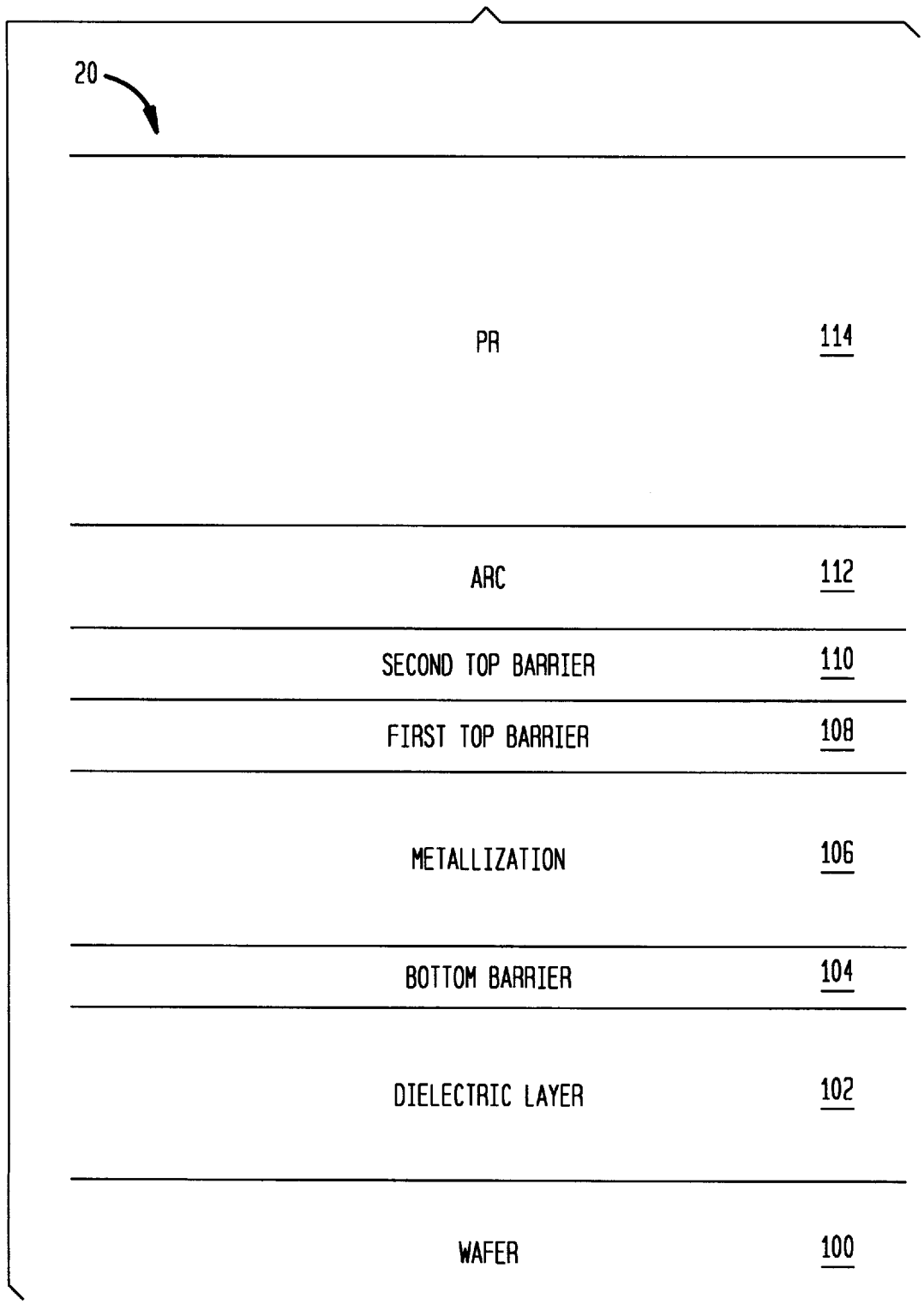
FIG. 1A illustrates a cross-section view of a layer stack, representing the layers that is formed during the fabrication of a typical semiconductor IC.

In the following description, numerous specific details are set forth in order to provide a thorough understanding of the present invention. It will be obvious, however, to one skilled in the art, that the present invention may be practiced without some or all of these specific details. In other instances, well known process steps have not been described in detail in order not to unnecessarily obscure the present invention.

In accordance with one embodiment of the present invention, there is provided an improved technique for etching through the layer stack that includes etching at least partially through a barrier layer using a high-sputter component etch. The high-sputter component etch advantageously increases sputtering of the photoresist layer. This increased sputtering of the photoresist layer causes additional carbon to be present in the etch reactor and adsorbed into the sidewall deposition.

By increasing the carbon content of the sidewall deposition, the sidewall deposition becomes more soluble and therefore easier to remove daring subsequent photoresist strip/water rinsing processes. The increased physical sputtering also reduces the physical dimension of the sidewall deposition by reducing the height of the sidewalls of the etched layer stack as more of the photoresist is sputtered away (e.g., by reducing height 120 of FIG. 1B as the photoresist feature becomes thinner and/or more sloped).

In one embodiment, the high-sputter component etching may be achieved by lowering pressure in the etch chamber to increase the bias voltage of the layer stack. With reduced process pressure, the mean free path inside the plasma chamber is increased so that the sputtered barrier layer material is more easily exhausted out of the plasma chamber, thereby reducing their adsorption into the sidewall deposition. With reduced adsorption of the inorganic material, the sidewall deposition may be more soluble and easily removed during the subsequent photoresist stripping and/or water rinsing steps.

In accordance with another embodiment of the present invention, there is further provided a low-sputter component etch for etching at least partially through the metallization layer. Since the metallization layer is usually substantially thicker than the top barrier layer in most layer stacks, it is advantageous to employ a low-spitter component etch to etch through the metallization layer to reduce photoresist erosion. If the high-sputter component etch that is employed to etch through the top barrier layer(s) had been employed instead, the longer duration of the metallization etch may cause an undue amount of protective photoresist to be sputtered away, thereby reducing the critical dimension the resulting interconnect line. As can be appreciated by those skilled, this is highly undesirable as it may render the interconnect lines more susceptible to current-induced and/or heat-induced damage during operation.

Optionally, the method further includes, in another embodiment, a high-sputter component etch step for etching through the bottom barrier layer(s). Again, the use of high sputter causes more of the photoresist material to be sputtered off, thereby increasing the carbon component of the sidewall polymer. If the high-sputter component etch is caused by reducing etch pressure, more of the lower barrier layer material is evacuated, thereby reducing the amount of inorganic material adsorbed into the sidewall polymer. A rail that is high in carbon and low in adsorbed inorganic material may be more easily removed during the subsequent photoresist strip and/or water rinsing processes.

Figure 2A:
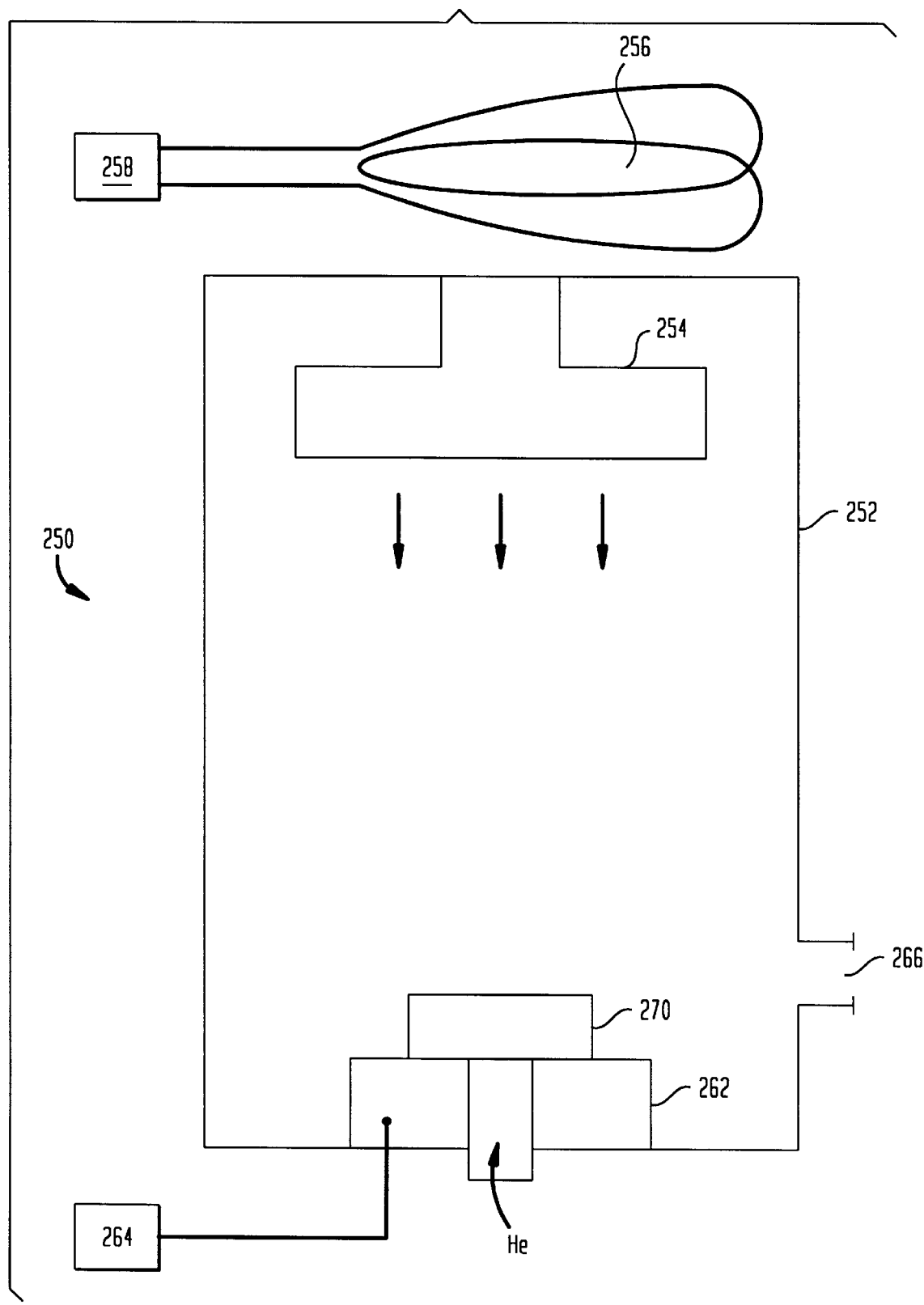
FIG. 2A is a schematic diagram of an etch reactor suitable for practicing the inventive etch technique.

Although the inventive etch process may be performed using any suitable etch technique, a RIE is employed in one embodiment. The RIE is performed using, for example, a transformer-coupled plasma reactor known as the TCP™ 9600 SE plasma reactor, which is available from Lam Research Corp. of Fremont, Calif. To facilitate discussion, FIG. 2A illustrates a simplified schematic of the TCP™ 9600 SE plasma reactor, including wafer 270. Referring to FIG. 2A, a reactor 250 includes a plasma processing chamber 252. Above chamber 252, there is disposed a source 256 to generate plasma, which is implemented by a coil in the example of FIG. 2A. Coil 256 is typically energized by a RF generator 258 via a matching network (not shown). Within chamber 252, there is provided a shower head 254, which preferably includes a plurality of holes for releasing gaseous source materials, e.g., the etchant source gases, into the RF-induced plasma region between itself and wafer 270.

The gaseous source materials may also be released from ports built into the walls of chamber 252 itself. Etchant source chemicals include, for example, $Cl_2$ and $BCl_3$ when etching through aluminum or one of its alloys. Other chlorine-based etchant chemicals may also be used. Examples include $CH_4$, HI, HBr, HCl, $CHCl_3$, which may be employed along with optional inert and/or nonreactive gases.

To facilitate etching, wafer 270 is introduced into chamber 252 and disposed on a chuck 262, which acts as a second electrode and is preferably biased by a radio frequency generator 264 (also typically via a matching network). The wafer comprises a plurality of ICs fabricated thereon. The ICs, for example, include logic devices such as PLAs, FPGAs and ASICs or memory devices such as random access memories (RAMs), dynamic RAMs (SRAMs), synchronous DRAMs (SDRAMs), or read only memories (ROMs). The wafer is diced upon completion, separating the ICs into individual chips. When the RF power is turned on, species are formed from the etchant source gas to react with wafer 270 and etch away at the plasma-contacting layer(s). The by-products, which may be volatile, are then exhausted through an exit port 266.

FIG. 2B shows, in accordance with one embodiment of the present invention, a multiple step metal etching process 300. To simplify discussion, process 300 is performed on the layer stack of FIG. 1A although it should be understood that the inventive process may be performed on any analogous layer stack formed during the fabrication of an IC. By way of example, it may be performed on a layer stack having only one top barrier layer (instead of two as shown in FIG. 1A).

Figure 1B:
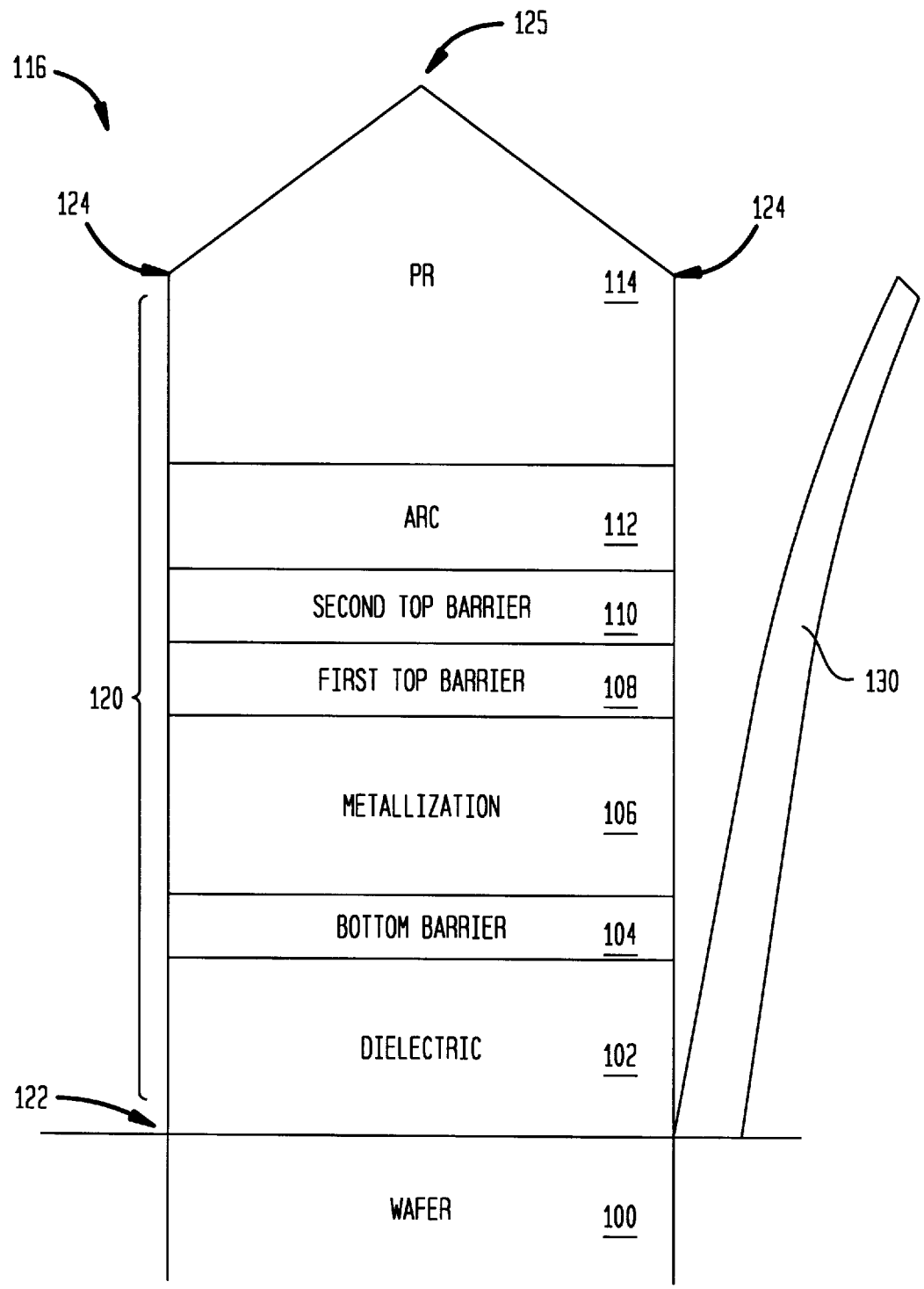
FIG. 1B illustrates a cross-section view of an interconnect line formed from the layer stack of FIG. 1A, including the rails that remain after photoresist stripping and/or water rinsing.

In step 302, etching is performed at least partially through the top barrier layer using a high-sputter component etch. Since this first high-sputter component etch is employed to "break through" the barrier layer(s), it is referred to herein as the break-through etch. In the context of FIG. 1A, the top barrier layer comprises first and second top barrier layers 108 and 110. If ARC layer 112 in FIG. 1B is organic, it may be useful to break through this ARC layer first with gases such as $N_2$, Ar, $O_2$, $CHF_3$, $CF_4$, $CH_3F$, CO, $CO_2$, $C_4F_8$ and/or other suitable chemistry.

Increasing the physical sputter component of the break-through etch results in a greater amount of photoresist material being sputtered away. As mentioned earlier, this has the effect of reducing the height of the polymer rail, e.g., it lowers point 124 of FIG. 1B, thereby reducing the height of rail 130. As a result, less polymer material has to be removed during the subsequent photoresist strip and/or water washing step.

More importantly, the increase in photoresist sputtering increases the density of the photoresist material in the reactor chamber. Accordingly, more of the sputtered photoresist is absorbed into the features' sidewalls. As is known, photoresist particles are high in carbon content. The increased adsorption or absorption of the photoresist material into the sidewalls thus increases the carbon content of the polymer deposition. As can be appreciated by those skilled in the art, polymer rails with high carbon contents tend to strip more easily during the subsequent photoresist stripping step.

In one embodiment, the high sputter component break-through etch is achieved by reducing the pressure within the plasma processing chamber to increase the bias voltage on the wafer. Reducing the chamber pressure to achieve the high sputter component etch also yields another important advantage, namely reducing the amount of inorganic materials adsorbed into the polymer sidewall. This is because the reduction in chamber pressure increases the mean free path therein and/or reducing the density of particles within the chamber during the break-through etch. Accordingly, less of the etched barrier layer material is present in the chamber to be adsorbed into the polymer sidewalls. As can be appreciated to those skilled, the reduction in inorganic material adsorption renders the polymer rails more soluble and increases the ease with which the polymer rails may be removed during the subsequent photoresist strip and/or water washing steps.

It should be noted, however, that the high sputter component etch may also be achieved by increasing the bias power setting. Increasing the bias (or bottom) power setting is a mechanism for changing the bias voltage of the substrate (and the sputter component of the etch) that is independent from the aforementioned changing the process pressure. Accordingly, the overall effect on the bias voltage of the substrate (and the sputter component of the etch) depends on which of these two mechanisms is more dominant (if both mechanisms are employed simultaneously in a process step).

Alternatively, the top (or source) power setting may be reduced to increase the sputter component, although it may be necessary in some cases to reduce the lower or bottom bias power setting as well to maintain plasma stability. This is another independent mechanism that may be employed to change the bias voltage on the substrate (and the sputter component of the etch). In these embodiments, the advantages associated with the high sputter component etch, i.e., reducing the height of the polymer rails and increasing their carbon content, are advantageously maintained.

If the high sputter component etch is maintained for etching through the entire layer stack, i.e., all the way through the metallization layer, the high sputter component of the etch may unduly erode the protective photoresist mask. When this happens, the critical dimension of the interconnect lines is adversely affected. Accordingly, the high sputter component break through etch is preferably ended before an excessive amount of photoresist is eroded to cause variations in critical dimensions to exceed specified tolerances. In one embodiment, the high sputter component etch is terminated before the metallization layer is etched through. More preferably, the high sputter component break through etch is ended substantially as the barrier layer(s) is etched through. It should also be noted that the etching of metallization layer 106 in FIG. 1B may not require a high sputter etch component.

To etch through the remainder of the layer stack, there is further provided, in accordance with one embodiment of the present invention, a low sputter component main etch step. In this context, the low sputter component etch simply means an etch step that has a lower sputter component relative to the sputter component of the break-through etch. The main etch step is illustrated in FIG. 2B in step 304.

In one embodiment, the main etch is permitted to proceed at least partially through the metallization layer (e.g., metallization layer 106 of FIG. 1A) using a low-sputter component etch. In etching step 304, chemical reaction is the dominant etching mechanism. Because chemical reaction is more selective than physical sputtering, the rate of photoresist erosion of PR layer 114 is reduced relative to the photoresist erosion rate associated with the high sputter component break-through etch. The reduced photoresist erosion helps to ensure that sufficient protective photoresist remains on the wafer surface to protect the critical dimension of etched features (i.e., the interconnect lines in this case).

In one embodiment, the low sputter component etch is achieved by increasing the process pressure relative to the process pressure that exists during the break through etch. In decoupled or high density plasma, increase in process pressure typically translates into reduced photoresist consumption. This enables the etch to be completed on a limited photoresist budget. Also, the top power and bottom bias power settings may be increased in order to maintain desired profiles of interconnect lines by achieving ion directionality.

The low sputter component etch may continue until the layer stack is etched through. In one embodiment, however, there is further provided another high sputter component etch to etch through the bottom barrier layer. In this context, the high sputter component etch simply means an etch step that has a higher sputter component relative to the sputter component of the main etch. This high sputter component etch may be achieved using the same technique employed in the break-through etch step. The high sputter component etch again increases the carbon content of the sidewall polymer deposition and/or reduces the amount of adsorbed inorganic materials in the sidewall polymer deposition. This additional high sputter component etch is shown in FIG. 2B as step 306 in which etching is performed at least partially through the bottom barrier layer using a high-sputter component etch. This high sputter component etch may be allowed to extend for some time after the laser stack is etched through to achieve over-etching.

Again, the high sputter component etch step 306 advantageously reduces the height of the resulting polymer sidewall to ease its removal during the subsequent photoresist strip and/or water washing step. The resulting polymer sidewall is also rendered more soluble by increasing the carbon content (and reducing the inorganic material content if low process pressure is employed to achieve the high sputter component etch).

FIG. 3 shows layer stack 20 of FIG. 1A after being etched into interconnect line 216 in accordance with the inventive etch technique. Compared to interconnect line 116 of prior art FIG. 1B, the height of the sidewall is lower due to the use of the high sputter component etches. In other words, height 220 FIG. 3 is reduced compared to height 120 of FIG. 1B. Due to the higher carbon content and/or the lower inorganic material content, rails 230 is more soluble and easily removed during the subsequent photoresist stripping and/or water washing processes.

Table 1 below shows the approximate process parameters that may be suitable for performing the high sputter component break through etch in a TCP™ 9600 SE plasma reactor. In this table, an approximate suitable range, an approximate preferred range, and an approximate more preferred range are shown. In the tables that follow, the etches are performed on a 82–300 mm wafer. It should be apparent to those skilled in the art given this disclosure that the disclosed ranges may be varied to perform the described etches in other etch chambers and/or for other wafer sizes.

TABLE 1

| | BT (Break Through) | | | | | | |
|---|---|---|---|---|---|---|---|
| | Pressure (mT) | Top Power (W) | Bottom Power (W) | $Cl_2$ (sccm) | HCl | $N_2$ (sccm) | $He_{back}$ (T) | Temp. °C. |
| Appr. Range | 2–10 | 75–250 | 125–250 | 30–200 | 10–50 | 0–25 | 4–14 | 20–70 |
| Appr. Pref Range | 5–10 | 120–175 | 150–225 | 50–100 | 15–30 | 5–20 | 6–11 | 30–60 |
| Appr. More Pref. Range | 5–7 | 130–160 | 160–180 | 90–130 | 15–25 | 10–20 | 8–10 | 40–50 |

Table 2 below shows the approximate process parameters that may be suitable for performing the lower sputter component main etch step in a TCP™ 9600 SE plasma reactor. In this table, an approximate suitable range, an approximate preferred range, and an approximate more preferred range are shown. In Table 2, the process pressure has been increased to decrease the bias voltage (and the sputter component of the etch). Although the bias (or bottom) power is shown to have increased relative to the bias (or bottom power) setting employed in Table 1, the overall effect on the substrate bias voltage (and the sputter component of the etch) is to lower it. This fact underscores the independent nature of these two mechanisms (bias power setting and process pressure) on the substrate bias voltage (and the sputter component of the etch).

TABLE 2

Main Etch

|  | Pressure (mT) | Top Power (W) | Bottom Power (W) | $Cl_2$ (sccm) | HCl | $N_2$ (sccm) | $He_{back}$ (T) | Temp. °C. |
|---|---|---|---|---|---|---|---|---|
| Appr. Range | 12–20 | 125–300 | 150–325 | 30–200 | 10–50 | 0–25 | 4–14 | 20–70 |
| Appr. Pref. Range | 12–16 | 150–225 | 175–250 | 50–130 | 15–30 | 5–20 | 6–11 | 30–60 |
| Appr. More Pref. Range | 12–14 | 185–210 | 190–225 | 90–120 | 15–25 | 10–20 | 8–10 | 40–50 |

Table 3 below shows the approximate process parameters that may be suitable for performing the high sputter component etch step (for etching through the bottom barrier layer and/or for the over-etch) in a TCP™ 9600 SE plasma reactor. In this table, an approximate suitable range, an approximate preferred range, and an approximate more preferred range are shown. In Table 3, the process pressure has been decreased to increase the bias voltage (and the sputter component of the etch). Although the bias (or bottom) power is shown to have decreased relative to the bias (or bottom power) setting employed in Table 1, the overall effect on the substrate bias voltage (and the sputter component of the etch) is to increase it. This fact again underscores the independent nature of these two mechanisms (bias power setting and process pressure) on the substrate bias voltage (and the sputter component of the etch).

TABLE 3

Over Etch

|  | Pressure (mT) | Top Power (W) | Bottom Power (W) | $Cl_2$ (sccm) | HCl | $N_2$ (sccm) | $He_{back}$ (T) | Temp. |
|---|---|---|---|---|---|---|---|---|
| Appr. Range | 2–10 | 75–250 | 125–250 | 30–200 | 10–50 | 0–25 | 4–14 | 20–70 |
| Appr. Pref. Range | 5–10 | 120–175 | 150–225 | 50–100 | 15–30 | 5–20 | 6–11 | 30–60 |
| Appr. More Pref. Range | 5–7 | 130–160 | 160–180 | 50–85 | 15–25 | 10–20 | 8–10 | 40–50 |

While this invention has been described in terms of several illustrative embodiments, there are alterations, permutations, and equivalents which fall within the scope of this invention. For example, although the inventive sidewall buildup reduction technique is disclosed herein mainly with reference to DRAMs to facilitate consistent discussion and ease of understanding, it should be understood that the invention is not so limited. It is expected that the disclosed sidewall buildup reduction technique is also applicable to the manufacture of any semiconductor device (e.g., microprocessor, logic, memory device, and the like) that requires etching of the metallization layer. It should also be noted that there are may alternative ways of implementing the methods and apparatuses of the present invention.

It is therefore intended that the following appended claims be interpreted as including all such alterations, permutations, and equivalents as fall within the true spirit and scope of the present invention.

What is claimed is:

1. In a plasma processing chamber, a method for etching through a selected portion of a layer stack, said layer stack comprising a metallization layer, a first barrier layer disposed adjacent to said metallization layer, and a photoresist layer disposed above said metallization layer, comprising:

etching at least partially through said first barrier layer using a high sputter component etch; and etching at least partially through said metallization layer using a low sputter component etch, said low sputter component etch having a sputter component lower than a sputter component of said high sputter component etch.

2. The method of claim 1 wherein said etching with said high sputter component etch is achieved by employing an etch pressure that is lower than an etch pressure associated with said low sputter component etch.

3. The method of claim 1 wherein a first bias voltage of said substrate during said high sputter component etch is higher than a second bias voltage of said substrate during said low sputter component etch.

4. The method of claim 1 wherein said metallization layer comprises aluminum.

5. The method of claim 4 wherein said first barrier layer comprises Ti.

6. The method of claim 1 wherein a chlorine-containing chemistry is employed for one of said high sputter component etch and said low sputter component etch.

7. The method of claim 1 further comprising:
etching at least partially through a bottom barrier layer different from said first barrier layer using another high sputter component etch, said first barrier layer being disposed above said metallization layer, said bottom barrier layer being disposed below said metallization layer, said another high sputter component etch having a sputter component higher than said sputter component of said low sputter component etch.

8. The method of claim 7 wherein said metallization layer comprises Al—Cu.

9. The method of claim 1 wherein at least one of said high sputter component etch and said low sputter component etch is an etch using reactive ion etching (RIE).

10. The method of claim 1 wherein said layer stack is employed in dynamic random access memory (DRAM) manufacture.

11. In a plasma processing chamber, a method for etching through a selected portion of a layer stack, said layer stack comprising a metallization layer, a first barrier layer disposed adjacent to said metallization layer, and a photoresist layer disposed above said metallization layer, comprising:
etching at least partially through said first barrier layer using a first chamber pressure; and
etching at least partially through said metallization layer using a second chamber pressure higher than said first chamber pressure, wherein said first chamber pressure is configured to cause said first barrier layer to be etched with a higher sputter component then a sputter component associated with said second chamber pressure.

12. The method of claim 11 wherein said layer stack is employed in dynamic random access memory (DRAM) manufacture.

13. The method of claim 11 further comprising:
etching at least partially through a bottom barrier layer different from said first barrier layer using a third chamber pressure lower than said second chamber pressure, said first barrier layer being disposed above said metallization layer, said bottom barrier layer being disposed below said metallization layer, wherein said third chamber pressure is configured to cause said bottom barrier layer to be etched with a higher sputter component than said sputter component associated with said second chamber pressure.

14. The method of claim 13 wherein at least one of said first barrier layer and said bottom barrier comprises Ti and said metallization layer comprises aluminum.

15. The method of claim 14 wherein said layer stack is employed in dynamic random access memory (DRAM) manufacture.

16. The method of claim 14 wherein said etching at least partially through said metallization layer employs a chlorine-containing chemistry.

17. The method of claim 16 wherein said etching at least partially through said metallization layer includes reactive ion etching (RIE).

18. The method of claim 13 wherein said first chamber pressure is between about 2 mTorr and about 10 mTorr.

19. The method of claim 18 wherein said second chamber pressure is between about 12 mTorr and about 20 mTorr.

20. In a plasma processing chamber, a method for reducing sidewall polymer buildup during etching through a selected portion of a layer stack, said layer stack comprising a bottom barrier layer, a metallization layer disposed above said bottom barrier layer, a top barrier layer disposed above said metallization layer, and a photoresist layer disposed above said metallization layer, comprising:
etching at least partially through said top barrier layer using a first chamber pressure;
etching at least partially through said metallization layer using a second chamber pressure higher than said first chamber pressure, wherein said first chamber pressure is configured to cause said top barrier layer to be etched with a higher sputter component than a sputter component associated with said second chamber pressure; and
etching at least partially through said bottom barrier layer using a third chamber pressure lower than said second chamber pressure, wherein said third chamber pressure is configured to cause said bottom barrier layer to be etched with a higher sputter component than said sputter component associated with said second chamber pressure.

21. The method of claim 20 wherein said layer stack is employed in dynamic random access memory (DRAM) manufacture.

* * * * *